US012575410B2

(12) United States Patent
Iwai et al.

(10) Patent No.: US 12,575,410 B2
(45) Date of Patent: Mar. 10, 2026

(54) SEMICONDUCTOR DEVICE

(71) Applicant: Mitsubishi Electric Corporation, Tokyo (JP)

(72) Inventors: Yuji Iwai, Tokyo (JP); Takahiro Kuma, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 406 days.

(21) Appl. No.: 18/546,768

(22) PCT Filed: May 27, 2021

(86) PCT No.: PCT/JP2021/020165
§ 371 (c)(1),
(2) Date: Aug. 16, 2023

(87) PCT Pub. No.: WO2022/249388
PCT Pub. Date: Dec. 1, 2022

(65) Prior Publication Data
US 2024/0145330 A1 May 2, 2024

(51) Int. Cl.
*H01L 23/367* (2006.01)
*H01L 23/13* (2006.01)
*H01L 23/31* (2006.01)

(52) U.S. Cl.
CPC ............ *H01L 23/367* (2013.01); *H01L 23/13* (2013.01); *H01L 23/3121* (2013.01)

(58) Field of Classification Search
CPC .... H01L 23/13; H01L 23/367; H01L 23/3121
See application file for complete search history.

(56) References Cited

U.S. PATENT DOCUMENTS

2004/0161879 A1* 8/2004 Tsai ........................ H01L 23/36
257/E23.101
2008/0122068 A1* 5/2008 Kelly ................ H01L 23/49816
257/E23.101

FOREIGN PATENT DOCUMENTS

JP 2003-234365 A 8/2003

OTHER PUBLICATIONS

International Search Report issued in PCT/JP2021/020165; mailed Jul. 27, 2021.

* cited by examiner

*Primary Examiner* — Douglas M Menz
(74) *Attorney, Agent, or Firm* — Studebaker Brackett PLLC

(57) ABSTRACT

A backside conductors is configured such that an electrode for electrical connection to an outside is formed in addition to a heat sink in correspondence with each of a plurality of cavity structures, and a support member is formed so as to be at a position separated from dicing lines for dividing each of the cavity structures into an individual piece, arranged closer to the dicing lines than to the heat sink and the electrode, and interposed between a molding die and a board at a time of integral molding with the mold material.

15 Claims, 15 Drawing Sheets

SEMICONDUCTOR DEVICE

TECHNICAL FIELD

The present application relates to a semiconductor device.

BACKGROUND ART

As one of methods for manufacturing a semiconductor device, mold packaging is performed in which a large number of semiconductor elements are mounted on a circuit board, collectively sealed with a resin using a molding die, and then divided into a desired piece size by dicing (refer to, for example, Patent Document 1).

On the other hand, since heat generation of a semiconductor element increases accompanied by a higher output thereof, improvement in heat dissipation performance is required for a circuit board, but a resin or ceramic having low heat dissipation performance is used in many cases. Therefore, it is effective to cut the thermal resistance in the portion of the circuit board by adopting a cavity structure using a backside conductor (refer to, for example, Patent Document 1).

CITATION LIST

Patent Document

Patent Document 1: Japanese Patent Application Publication Laid-open, No. 2003-234365 (Paragraphs 0010 to 0020, FIG. 1 to FIG. 3)

SUMMARY OF INVENTION

Problems to be Solved by Invention

However, in the transfer molding process widely used for molded packages, molding pressure of around 10 MPa are typically applied. At this time, a region of the circuit board where the backside conductor is not arranged is left floated from the molding die and may be deformed owing to the molding pressure. To cope with the above, support pins could be provided to the molding die to support the circuit board. However, since it is necessary to arrange the support pins in accordance with the product individual piece size, the cost is increased for newly preparing a molding die for each individual piece size. Further, the thickness of the backside conductor varies in manufacturing, and the circuit board may not be supported by the support pins having a constant height. Therefore, it is difficult to obtain a semiconductor device that is low-cost and has a high heat dissipation performance.

The present application discloses a technique for solving the above-described problems and an object of the present application is to obtain a semiconductor device with high heat dissipation performance at low cost.

Means for Solving Problems

A semiconductor device disclosed in the present application is an article integrally molded with a mold material sealing a front side of a board including a semiconductor element, in which a plurality of cavity structures are formed in a matrix form by the board in which a plurality of openings are arranged in a matrix form and by backside conductors arranged on a backside of the board, and a portion of the backside conductors that blocks each of the plurality of openings from the backside functions as a heat sink on which the semiconductor element is mounted. In the backside conductors, a portion thereof serving as an electrode for electrical connection to an outside is formed in addition to the heat sink so as to correspond to each of the plurality of cavity structures, and a portion thereof that is at a position separated from dicing lines for dividing each of the cavity structures into an individual piece and is arranged closer to the dicing lines than to the heat sink and the electrode is formed to function as a support member interposed between a molding die and the board at a time of integral molding with the mold material.

Effect of Invention

According to the semiconductor device disclosed in the present application, in addition to the heat sink and the electrode, the support member interposed between the board and the molding die is formed using the backside conductors. Therefore, it is possible to obtain a semiconductor device that is low-cost and has high heat dissipation performance.

MODES FOR CARRYING OUT INVENTION

Embodiment 1

Figures 1A, 1B:
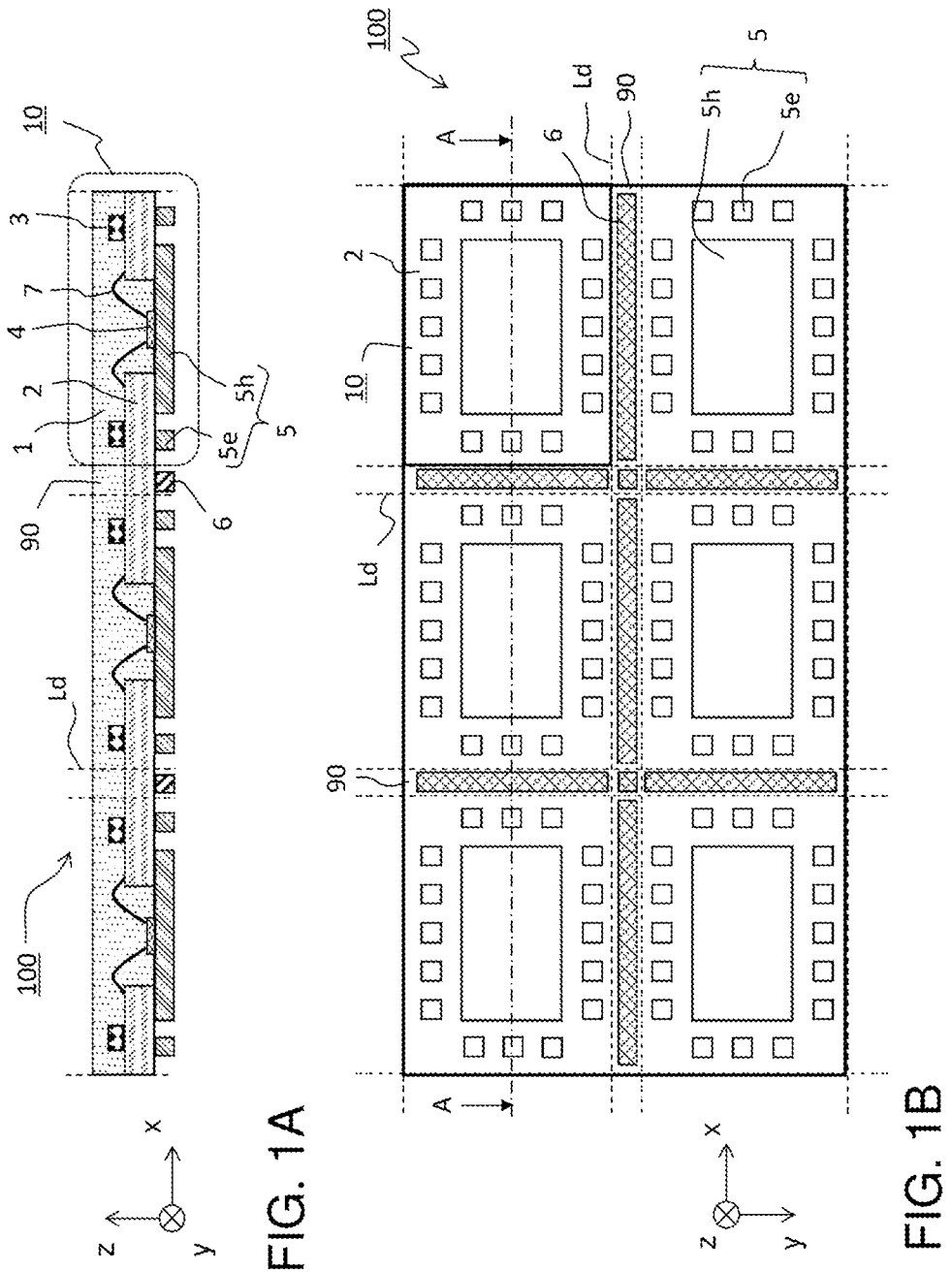
FIG. 1A and FIG. 1B are an end view and a bottom view, respectively, of a molded article before being cut into individual pieces of semiconductor device according to Embodiment 1.
Figure 2:
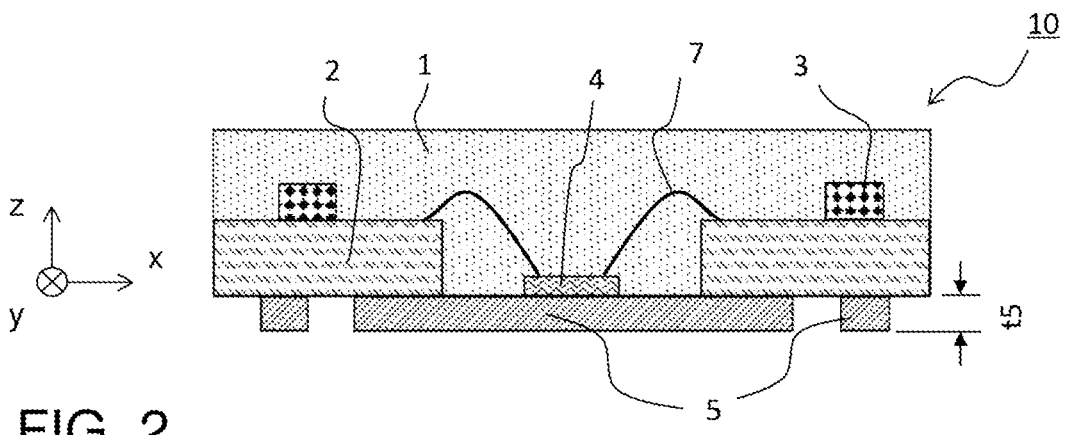
FIG. 2 is a cross-sectional view of an individual piece of a semiconductor device according to Embodiment 1.

FIG. 1A, FIG. 1B, and FIG. 2 are for explaining a configuration of a semiconductor device according to Embodiment 1, FIG. 1B is a bottom view of molded articles before an individual piece of the semiconductor device is cut out, as viewed from the side of backside conductors, FIG. 1A is an end view of a molded article corresponding to line A-A in FIG. 1B, and FIG. 2 is a cross-sectional view corresponding to an individual piece of FIG. 1A in the semiconductor device produced using the backside conductors having a thickness necessary to secure heat dissipation performance. Note that, although the bottom views including FIG. 1B do not show cross sections, support members are hatched to distinguish the support members from the backside conductors.

Figure 3A:
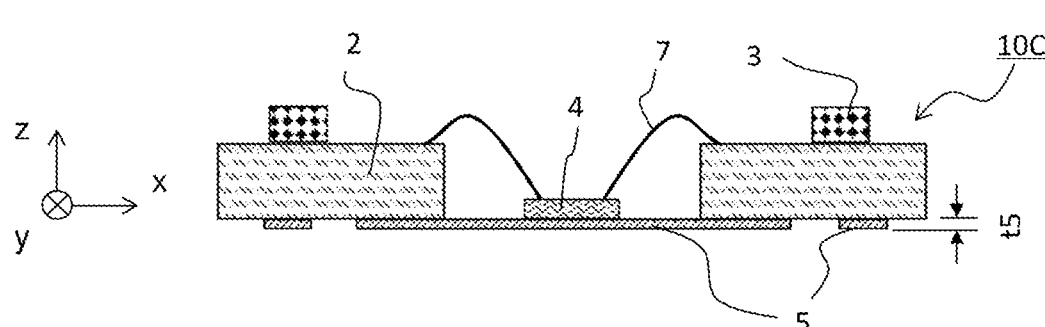
FIG. 3A and FIG. 3B each are a cross-sectional view of an individual piece of a semiconductor device according to a comparative example in which the thickness of the backside conductor is different.
Figure 3B:
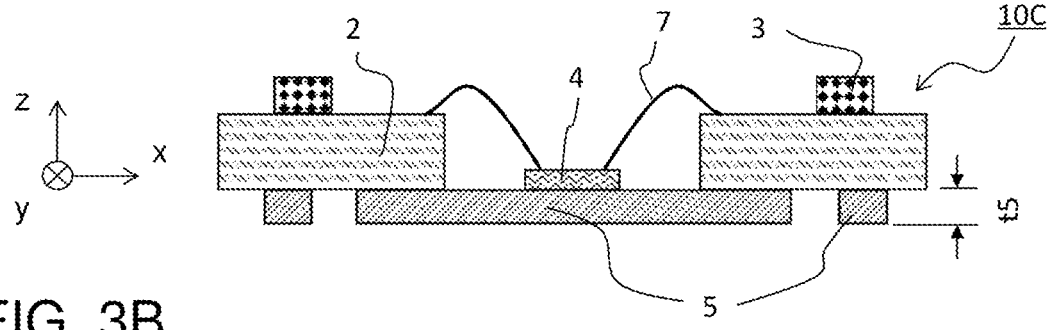
Figure 4:
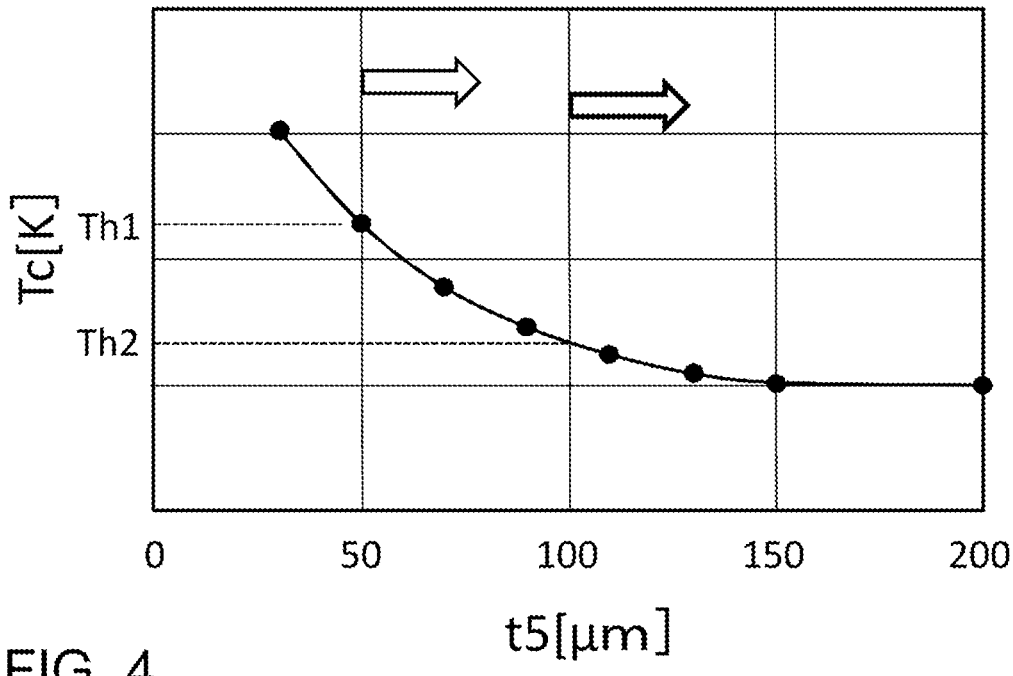
FIG. 4 is a diagram in the form of a line graph showing a relationship between a thickness of the backside conductor of the semiconductor device and a temperature during operation.

In addition, FIG. 3A and FIG. 3B, and FIG. 4 to FIG. 11C are for explaining comparative examples for describing effects in the semiconductor device of the present application, and FIG. 3A and FIG. 3B are cross-sectional views corresponding to FIG. 2, in which mold material portions of the semiconductor devices according to the comparative examples having different thicknesses of the backside conductors are omitted. FIG. 4 is a line graph showing a relationship between a thickness of the backside conductor and a chip temperature when semiconductor devices including the semiconductor device of the present application are operated.

Figures 5A, 5B:
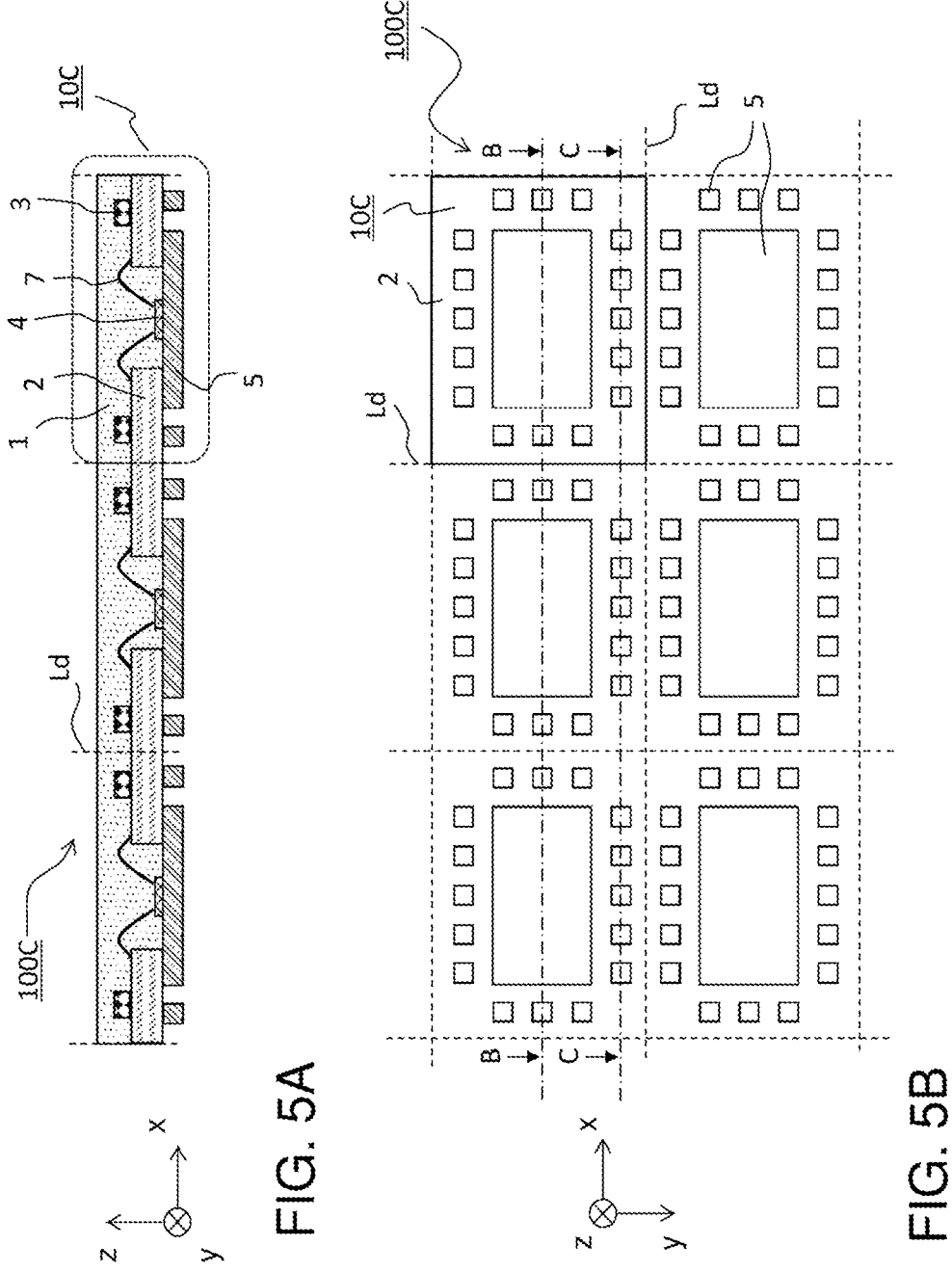
FIG. 5A and FIG. 5B are a cross-sectional view and a bottom view, respectively, of a molded article before being cut into individual pieces according to a comparative example.
Figures 6A, 6B:
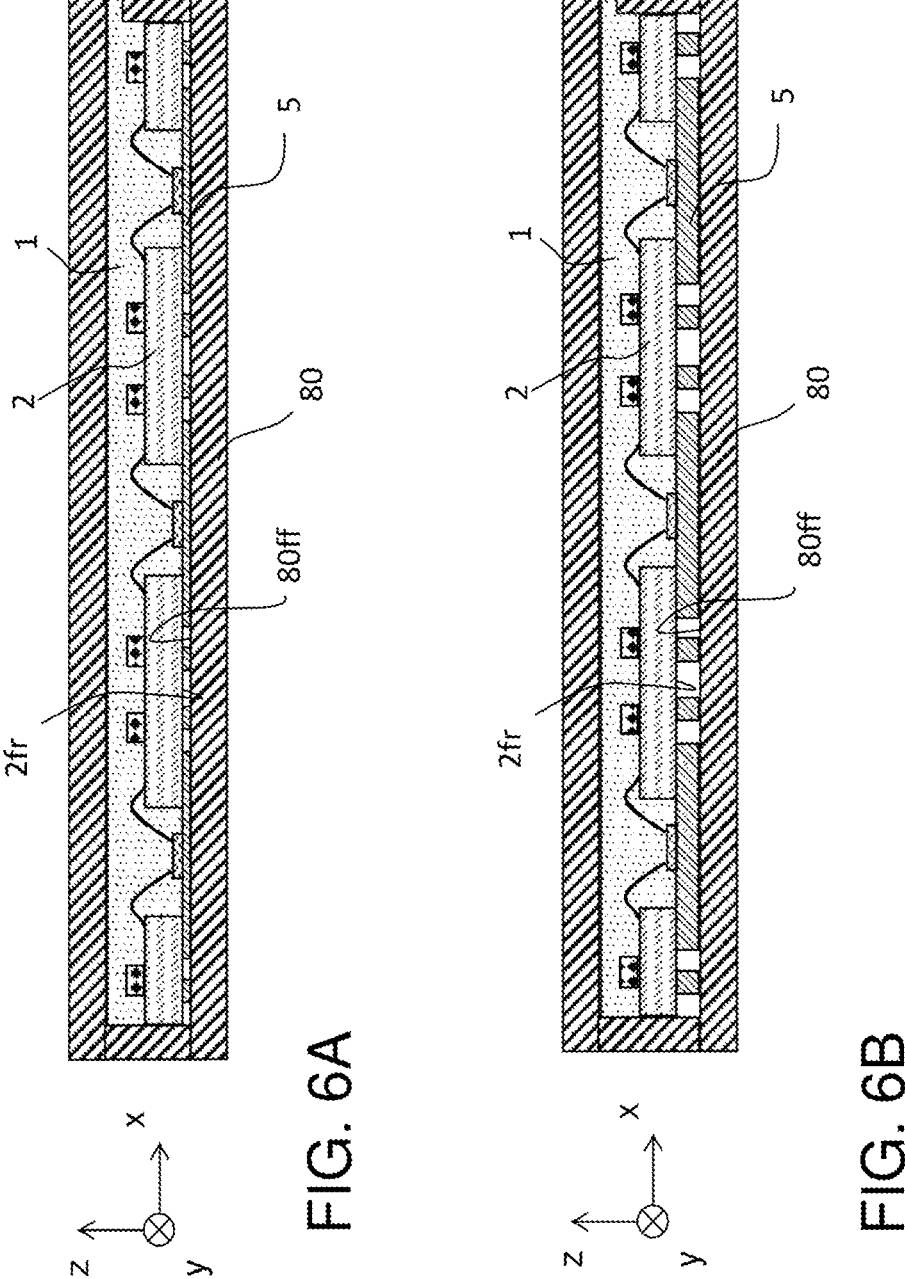
FIG. 6A and FIG. 6B are cross-sectional views in the molding dies when molded articles of the semiconductor devices are manufactured according to comparative examples in which the backside conductors having respective different thicknesses are used.
Figures 7A, 7B:
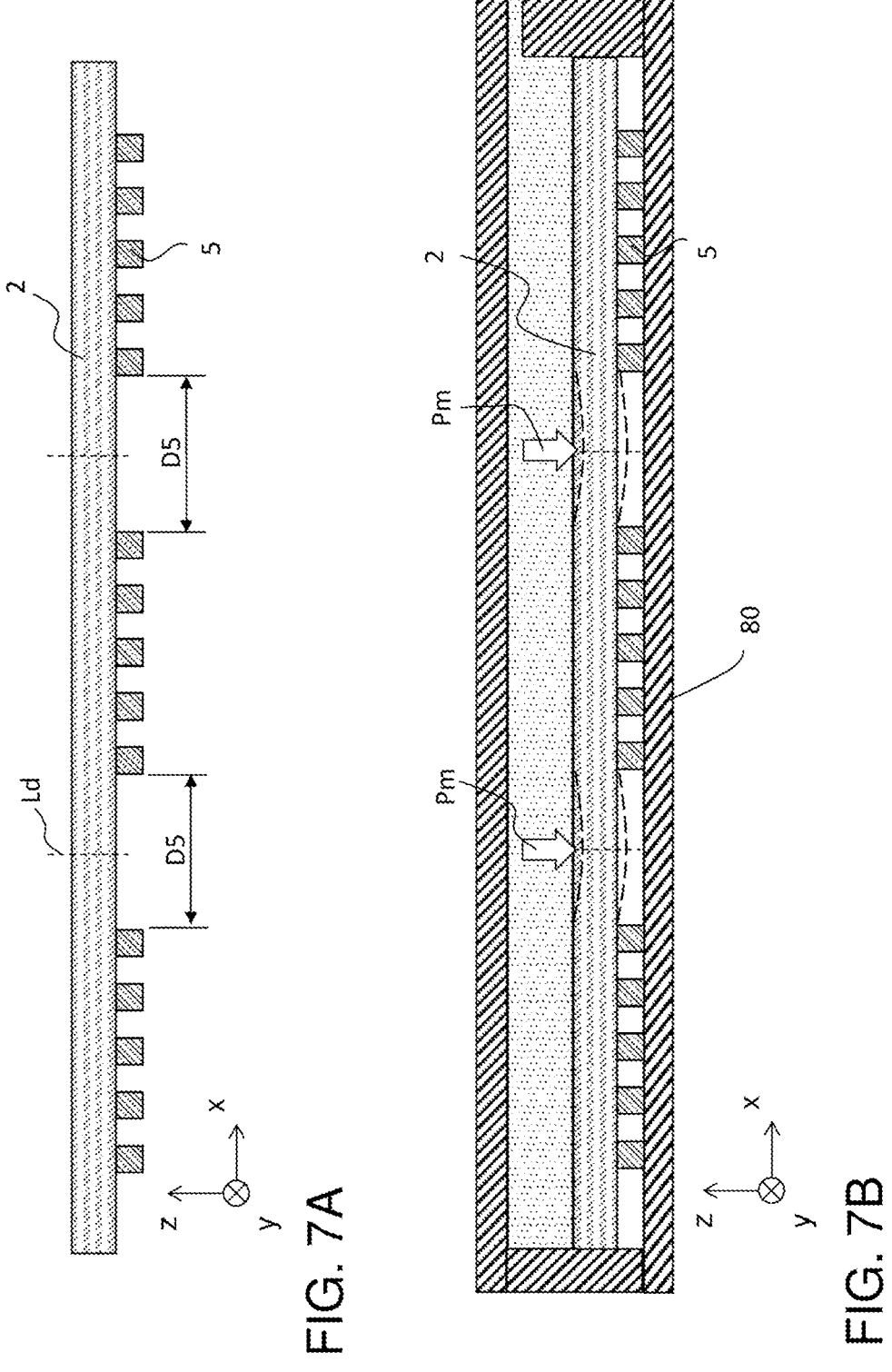
FIG. 7A and FIG. 7B are end views showing states before and during installation in the molding die, respectively, for explaining arrangement of the backside conductors when a molded product of the semiconductor device according to a comparative example is manufactured.

FIG. 5B is a bottom view of the molded article before cutting out the individual piece of the semiconductor device according to the comparative example viewed from the side of the backside conductors, and FIG. 5A is a cross-sectional view of the molded article taken along the line B-B of FIG. 5B. FIG. 6A and FIG. 6B are cross-sectional views taken along a line corresponding to the line B-B of FIG. 5B showing a state in which an article to be molded is set in a transfer molding die and a mold resin is filled by transfer molding process when molded articles of the semiconductor device having respective different thicknesses of the backside conductors according to the comparative examples are manufactured, and FIG. 7A and FIG. 7B are end views taken along a line corresponding to the line C-C of FIG. 5B showing states before and during installation in the molding die, respectively, for explaining the arrangement of the backside conductors when the molded product of the semiconductor device according to the comparative example shown in FIG.5A, FIG. 5B is manufactured.

Figure 8:
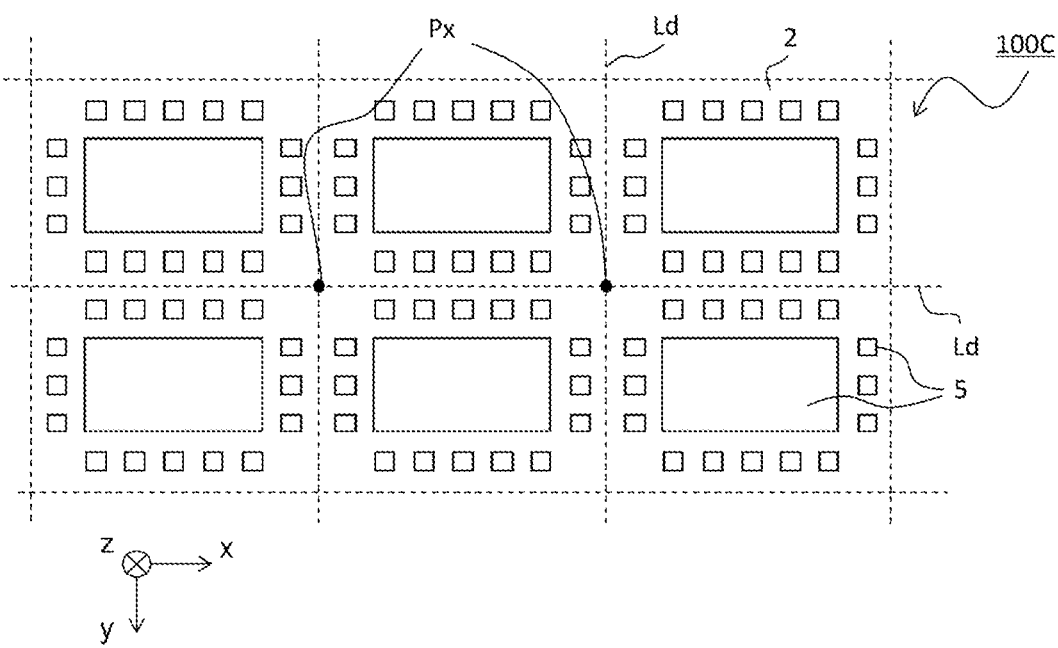
FIG. 8 is a bottom view of a molded article before an individual piece of the semiconductor device according to a comparative example is cut out.
Figure 9:
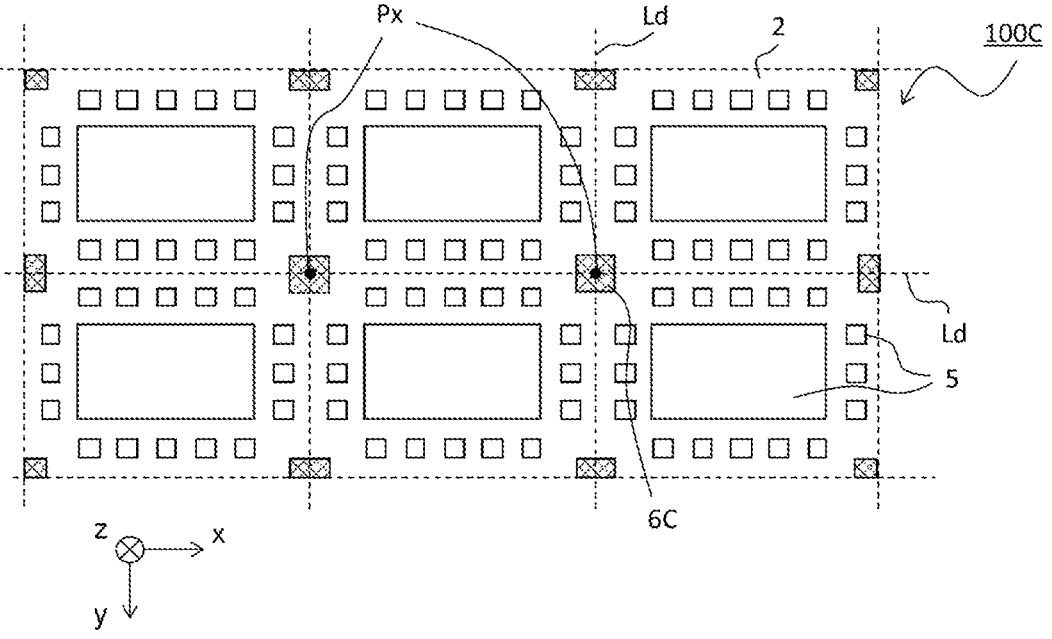
FIG. 9 is a bottom view of a molded article before an individual piece of the semiconductor device according to a comparative example is cut out.
Figures 10A, 10B:
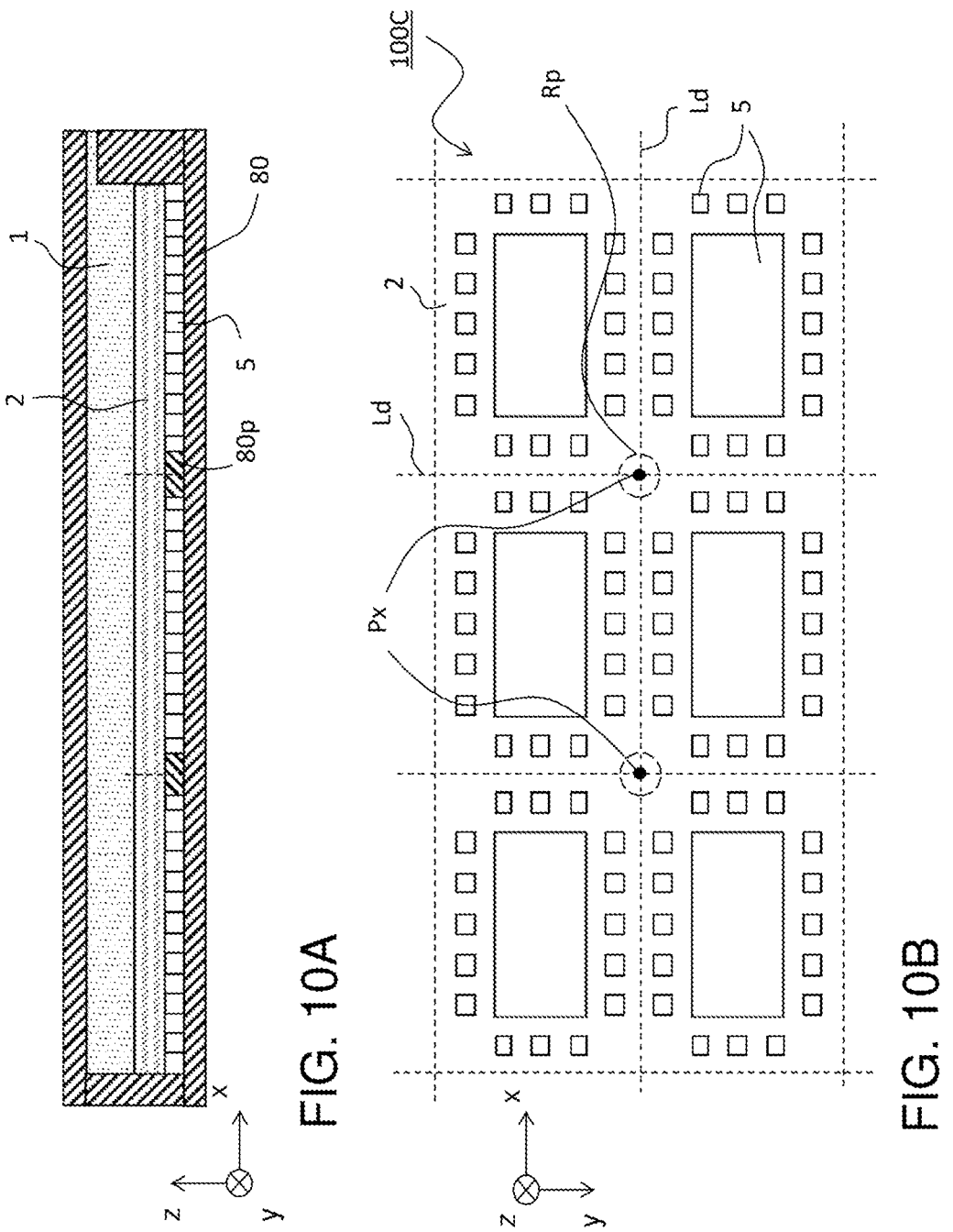
FIG. 10A and FIG. 10B are a cross-sectional view inside the molding die, which is taken along a dicing line, and a bottom view, respectively, when the molded article of the semiconductor device according to a comparative example is manufactured.
Figures 11A, 11B, 11C:
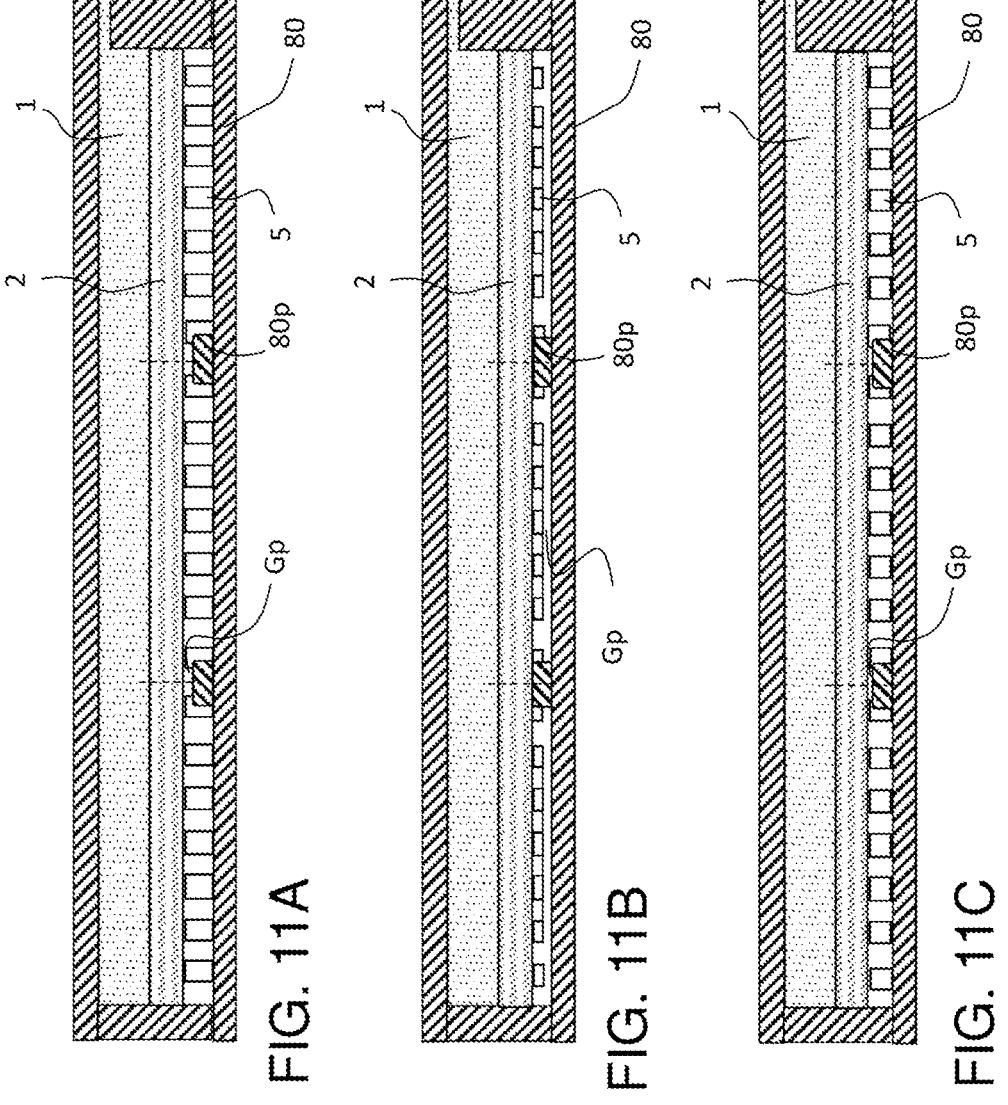
FIG. 11A to FIG. 11C are cross-sectional views inside the molding die, which are taken along the dicing line, when molded articles of the semiconductor devices according to comparative examples using backside conductors having respective different thicknesses are manufactured.

Further, FIG. 8 is a bottom view for explaining a state of intersection portions of the dicing lines in the molded article before cutting out the individual piece of the semiconductor device according to the comparative example, and FIG. 9 is a bottom view of the molded article before cutting out the individual piece of the semiconductor device according to the comparative example in which the support members are arranged at the intersection portions of the dicing lines. FIG. 10A and FIG. 10B are a cross-sectional view inside the molding die, which is taken along a dicing line running in a lateral direction (x-direction), and a bottom view, respectively, when a molded article of the semiconductor device is produced by a manufacturing method according to the comparative example in which support pins are arranged at the intersection portions of the dicing lines. Further, FIG. 11A to FIG. 11C are cross-sectional views inside the molding die, which are taken along dicing lines running in a lateral direction, when the molded articles of the semiconductor devices using backside conductors having respective different thicknesses are produced by the manufacturing method according to the comparative examples in which the support pins are arranged at the intersection portions of the dicing lines.

As shown in FIGS. 1A and 1B, and FIG. 2, a semiconductor device 100 of the present application is structured such that a board 2, in which a plurality of openings are arranged in a matrix form, and backside conductors 5 arranged on the backside of the board 2 are integrated to form a plurality of cavity structures arranged longitudinally and laterally in a matrix form. Each of the plurality of cavity structures is a recessed portion when viewed from the front side of the board 2, and a semiconductor chip (semiconductor element 4) is mounted on a backside conductor 5 that is exposed from the board 2 and serves as a heat sink 5h. As with a semiconductor device having a typical cavity structure, the semiconductor element 4 is electrically connected to electronic components 3 mounted on the board 2 by bonding wires 7 or the like, and the semiconductor device is an integrally molded article with a mold material 1 for sealing a mounting side of the semiconductor element 4. As the backside conductors 5, in addition to the portion functioning as the heat sink 5h, a portion functioning as an electrode 5e that is electrically connected internally to the electronic components 3, the semiconductor element 4, and the like and is exposed on the backside to be electrically connected to the outside is also formed.

A feature of the semiconductor device 100 of the present application is that support members 6 separated from the backside conductors 5 by patterning and arranged at positions closer to dicing lines Ld than the backside conductors 5 are provided as the molded article before being cut into an individual piece 10. Further, the backside conductors 5 together with the support members 6 each have a thickness t5 of 50 μm or more (preferably 100 μm or more). Here, prior to the detailed description thereof, a typical semiconductor device having a cavity structure in a matrix form will be described with reference to a comparative example. Note that the individual piece 10 after cutting, corresponding to each cavity structure, is distributed to be used for mounting in an electronic device, and the individual piece 10 is generally referred to as a semiconductor device. However, in the present application, an integrally molded article before the individual pieces 10 are separated, that is, the integrally molded article in which a plurality of cavity structures are formed in a matrix form is referred to as the semiconductor device 100.

First, as the function of the heat sink 5h, in order to examine the thicknesses t5 of a backside conductor 5 required for heat dissipation, as shown in FIG. 3A and FIG. 3B, the backside conductor 5 having a different thickness t5 (individual piece 10C) was set. Note that, among the semiconductor devices in the comparative example, the portions corresponding to the semiconductor device of the present application and having different specifications from the semiconductor device of the present application are distinguished by adding "C" to the end of the reference numerals. Then, setting the thickness t5 of the backside conductor 5 as a parameter, a relationship between the thickness and a chip temperature Tc being determined by the balance between heat generation and heat dissipation during operation was obtained by a simulation. The results are shown in FIG. 4. Note that the temperature on the vertical axis in FIG. 4 is on a linear scale.

As a result, it was found that the chip temperature Tc decreases as the thickness t5 increases, and the chip temperature Tc can be suppressed to be equal to or lower than a first threshold value Th1 when the thickness t5 is set to 50 μm or more. Further, it was found that by setting the thicknesses t5 to 100 μm or more, the chip temperature Tc can be suppressed to a second threshold value Th2 or less, which is lower than the first threshold value Th1, and thus the rise in the chip temperature Tc can be kept within an appropriate range even if there are variations in the element characteristics.

Typically, copper (Cu) is used for a conductor in a circuit board with high-density wiring, and the thickness of the conductor is often about 30 m. With the thickness above, however, the heat cannot be dispersed, so that heat dissipation performance is limited, and thus it is difficult to suppress the chip temperature Tc to be equal to or lower than the first threshold value Th1, contrary to the above. That is, in order to secure the heat dissipation performance to cope with the increase in the heat generation of the semiconductor element, it is considered effective to set the thicknesses t5 of the backside conductor 5 constituting the heat sink 5h to 50 μm or more, preferably 100 μm or more.

As described above, the circuit board having the cavity structure in which the thickness t5 of the heat sink 5h is larger than usual is transfer molded, so that the semiconductor device 100 (individual piece 10) having high heat dissipation performance as shown in FIG. 2 can be manufactured.

Here, when a typical semiconductor device is manufactured, as shown in FIG. 5A and FIG. 5B, the molded article (semiconductor device 100C) is divided by dicing along dicing lines Ld, so that the molded article can be processed into individual pieces 10C having a desired size.

At this time, a problem in manufacturing the semiconductor device 100C using the backside conductors 5 having the thickness t5 set on the basis of the heat dissipation performance will be examined. When the thickness t5 of the backside conductor 5 is set to 150 μm (FIG. 6B) in consideration of the heat dissipation, a gap (in the z-direction) between a board bottom surface 2fr and a mounting surface

80ff of a molding die 80 is larger than that in a case where the thickness t5 thereof is set to a typical value of 30 μm (FIG. 6A).

At this time, as shown in FIG. 7A, it can be seen that an interval D5 between the backside conductors 5 in the portion across the dicing line Ld, that is, the portion corresponding to the boundary between the individual pieces is wider than the other portions. In the transfer molding process, molding pressure around 10 MPa is typically applied, and the board 2 may be deformed by the molding pressure. In the region where the backside conductors 5 are arranged or in the region where the interval is narrow, even if stress is applied to the board 2 by the molding pressure, deformation does not occur because the backside conductors 5 support the board 2 from below. In contrast, in the region where the backside conductors 5 are not arranged, there is no structure for supporting the board 2 from below, and thus the board 2 may be deformed or damaged by the stress due to the molding pressure.

That is, since the board 2 cannot be supported from below in the portion across the dicing line Ld where the interval D5 between the backside conductors 5 is wide, the board 2 is easily deformed by the molding pressure Pm as shown by a broken line in FIG. 7B. On the other hand, as shown in FIG. 6A, in the case where the thickness t5 is as small as usual, even if the board 2 is deformed during the transfer molding process, the board 2 is immediately brought into contact with the molding die 80, so that further deformation is suppressed, resulting in a slight amount of board deformation and no noticeable quality impact. However, if the thickness t5 is large, the amount of deformation of the board is large at the time of transfer molding processing, so that a problem such as cracking of the board occurs.

In particular, as shown in FIG. 8, in the regions where intersections Px of the dicing lines Ld are included, the interval between the portions supported by the backside conductors 5 in both of the longitudinal and lateral directions is wide, so that the deformation of the board due to the molding pressure is large, and a defect such as cracking of the board 2 is likely to occur.

Here, as a countermeasure, as shown in a comparative example of FIG. 9, a method of narrowing the interval D5 by additionally disposing the backside conductors 5 as the support members 6C in the regions where the interval D5 between the backside conductors 5 are wide, such as the regions including the intersections Px of the dicing lines Ld, is considered. However, when a thick backside conductor 5 is cut, the load on the dicing blade is very large. Thus, it should be avoided to arrange the support members 6C at the intersections Px of the dicing lines Ld because of a concern about rapid progress of wear of the dicing blade and breakage of the dicing blade.

Therefore, for example, as shown in FIG. 10A and FIG. 10B, a method of preventing the deformation of the board 2 by providing a support pin 80p in the molding die 80 to support the circuit board is also considered. However, as described in the background art, since special processing is required for the molding die, there is a problem in that the die cost increases. In addition, since it is necessary to arrange the support pin 80p in accordance with a product individual piece size, a cost problem arises in that it is necessary to newly prepare a molding die having an installation region Rp (region corresponding to intersections Px) different for each individual piece size.

Furthermore, although the thicknesses t5 of the backside conductor has manufacturing variations, there is also a technical problem that the support pin 80p cannot cope with the variations in the thickness of the backside conductor because the height of the support pin 80*p* is constant. For example, as shown in FIG. 11A, for a circuit board finished with the thickness t5 being thicker than the height of the support pin 80*p*, a gap Gp (in the z direction) is generated between the support pin 80*p* and the board 2, and thus the board 2 is not supported, so that the effect of preventing the deformation of the board 2 cannot be sufficiently obtained.

Conversely, as shown in FIG. 11B, for a circuit board finished with the thickness t5 being thinner than the height of the support pin 80*p*, the gap Gp between the board 2 and the molding die 80 is formed owing to the support pin 80*p*, and the board is to be floated, so that the deformation of the board is to be enhanced. In contrast, in order to prevent the floating of the board 2, the height of the support pin 80*p* is to be adjusted to the thickness t5 of the backside conductor being finished thin. In the case above, as shown in FIG. 11C, when the thickness of the backside conductor is equal to a design center thickness t5, the support pin 80*p* cannot support the board 2. Further, in the case where a circuit board having the thick backside conductive members is to be molded using a molding die in which the height of the support pin 80*p* is adjusted to the thickness t5 of the backside conductive member finished thin, the gap Gp between the support pin 80*p* and the board 2 is further increased, so that the risk of breakage due to deformation of the board is increased.

Therefore, in the semiconductor device 100 according to Embodiment 1, as described with reference to FIG. 1A and FIG. 1B, the backside conductors 5 are formed by patterning on the backside of the board 2 such that the support members 6 are arranged between the individual pieces 10 and at positions avoiding the dicing lines Ld. That is, among the backside conductors, other than the backside conductors 5 functioning as the semiconductor device (individual piece 10), such as the heat sink 5*h* and the electrode 5*e*, the support members 6 are arranged in regions that are closer to the dicing lines Ld than to the backside conductors 5 and that do not overlap the dicing lines Ld.

Thus, this enables the support members 6 to narrow the interval D5, and even when the backside conductors 5 having the thickness t5 of 50 μm or more and excellent heat dissipation performance are used, the deformation of the board 2 due to the molding pressures Pm at the time of transfer molding can be prevented. However, as shown in FIG. 1B, the dicing line Ld is doubly formed for one division, and thus the number of times of dicing increases. However, the load applied to the dicing blade is lighter when the portions where the backside conductors 5 or the support members 6 are not arranged are cut twice than when the thick backside conductors are cut once. In addition, portions 90 between the doubly formed dicing lines Ld is not used as a product and is discarded, but even in this case, the advantages of the reduction in the load on the dicing blade and the increase in the yield due to the prevention of cracking of the board 2 are superior.

Furthermore, since it is not necessary for the processing of the molding die 80, such as the processing for the support pin 80*p*, it is possible to suppress the molding die processing cost. From a technical point of view, since the support members 6 are formed by dividing the backside conductors 5 by the patterning, even if there are variations in the thickness among products, the backside conductors 5 and the support members 6 have the same thickness t5 in one product, so that no gap is formed between the backside conductors 5 and the molding die 80. That is, the cost problem and the technical problem in the method using the support pin can be solved at the same time.

Variation Example

Note that, the arrangement of the support members 6, while avoiding the dicing lines Ld, at positions closer to the dicing lines Ld or the boundaries between the adjacent individual pieces 10 than the backside conductors 5 is not limited to the pattern described with reference to FIG. 1B. FIG. 12A to FIG. 12D are bottom views of the molded articles before being cut into individual pieces of the semiconductor devices according to the variation examples of Embodiment 1 with the support members having respective different patterns.

Figures 12A, 12B, 12C, 12D:
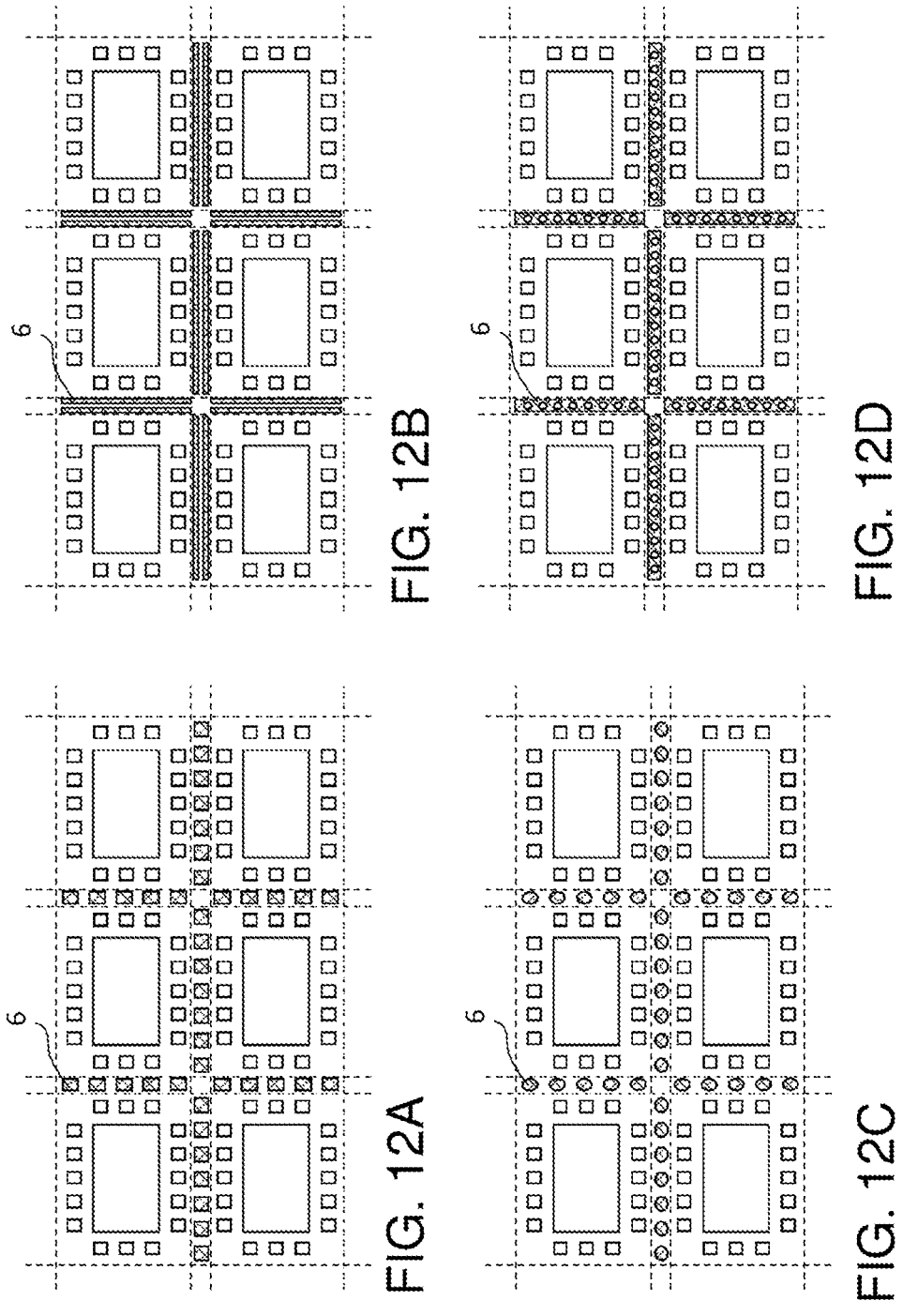
FIG. 12A to FIG. 12D are bottom views of molded articles before individual pieces of the semiconductor devices having support members with respective different patterns according to Embodiment 1 are cut out.

The shape, size, number of divisions, shape of division, and direction of division in the support members 6 are freely determined. That is, as shown in FIG. 12A, the above described effect can also be obtained by arranging a plurality of rectangular support members 6 divided along the dicing lines Ld in the regions surrounded by the dicing lines Ld. Alternatively, as shown in FIG. 12B, rectangular support members 6 divided in a direction perpendicular to the dicing lines Ld may be arranged.

In addition, as shown in FIG. 12C, a plurality of circular support members 6 divided along the dicing lines Ld may be arranged in the regions surrounded by the dicing lines Ld. Further, as shown in FIG. 12D, the support member 6 having void portions on the inner side thereof in the plane (x-y plane) direction may be arranged. Furthermore, a combination of multiple shapes, multiple sizes, multiple number of divisions, multiple division shapes, and division directions may be used.

Embodiment 2

Figures 13A, 13B:
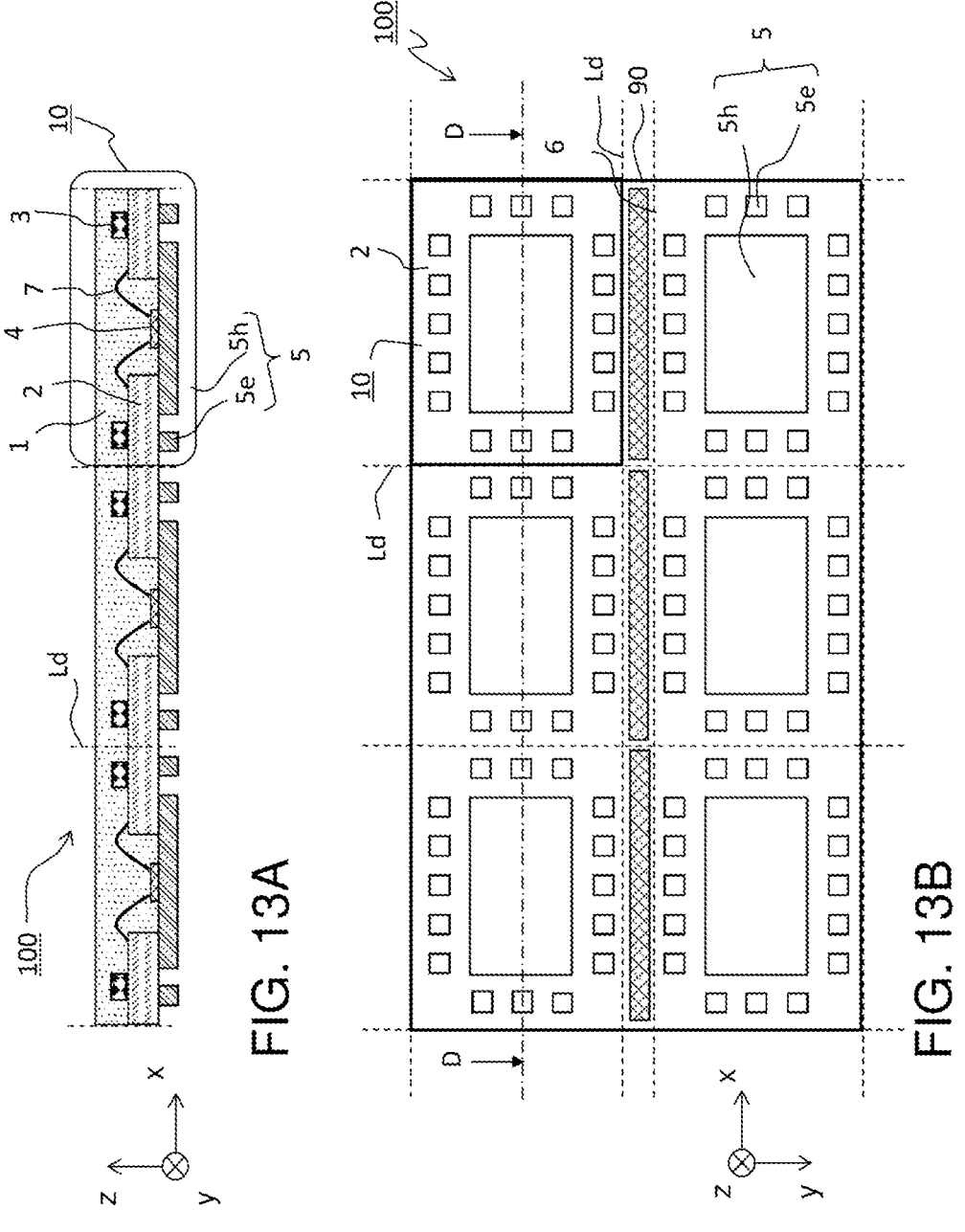
FIG. 13A and FIG. 13B are an end view and a bottom view, respectively, of a molded article before being cut into individual pieces of a semiconductor device according to Embodiment 2.

In Embodiment 1, examples has been described in which the dicing line at each boundary between the adjacent individual pieces is doubly formed and the support members are provided between the double lines. In Embodiment 2, an example will be described in which only the dicing line of the boundaries in one direction among the boundaries between the adjacent individual pieces is doubly formed and the support members are provided between the double lines. FIG. 13A and FIG. 13B are for explaining the configuration of a semiconductor device according to Embodiment 2, and FIG. 13B is a bottom view of a molded article before individual pieces of the semiconductor device are cut out as viewed from the backside conductor side, and FIG. 13A is an end view of the molded article corresponding to the line D-D of FIG. 13B.

Figures 14A, 14B:
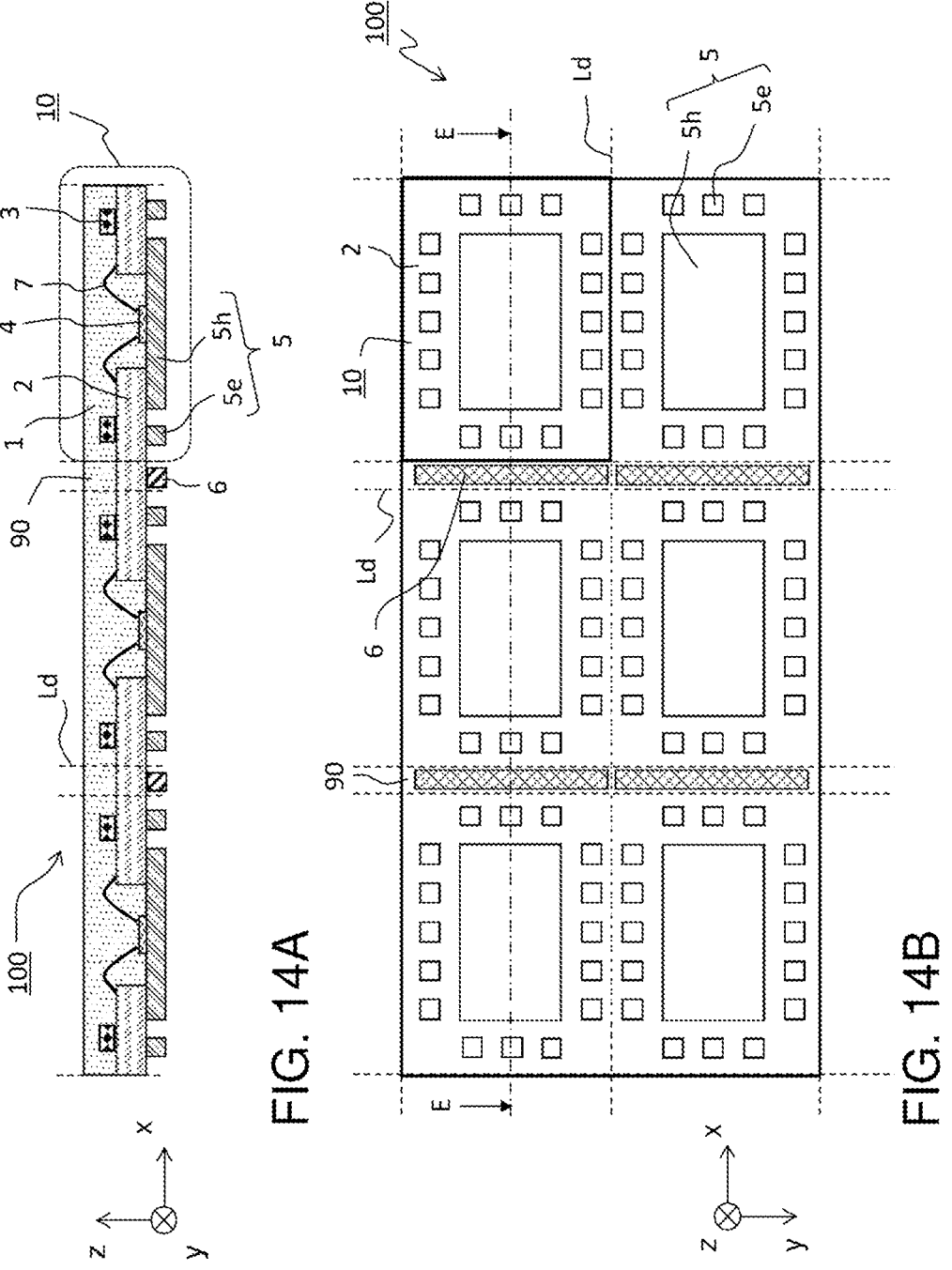
FIG. 14A and FIG. 14B are an end view and a bottom view, respectively, of a molded article before being cut into individual pieces of the semiconductor device according to a variation example of Embodiment 2.

Similarly, FIG. 14A and FIG. 14B are for explaining a configuration of a semiconductor device according to a variation example of Embodiment 2, and FIG. 14B is a bottom view of a molded article before individual pieces of the semiconductor device are cut out as viewed from the backside conductor side, and FIG. 14A is an end view of the molded article corresponding to the line E-E in FIG. 14B. Note that, except for the arrangement of the support members and the setting of the dicing lines, Embodiment 2 is the same as Embodiment 1, so that the description of the same parts will be omitted and FIG. 2 will be referred to.

In the semiconductor device 100 according to Embodiment 2 as in Embodiment 1, as shown in FIG. 13A and FIG. 13B, the board 2 and the patterned backside conductors 5 are integrated to form a cavity structure, and the backside conductors 5 are used as the heat sink 5*h* on which the semiconductor element 4 is mounted. The semiconductor element is electrically connected to the electronic components 3 mounted on the board 2 with bonding wires 7 or the like, and is sealed with a molding material 1. As the backside conductor 5, in addition to the portion functioning as the heat sink 5*h*, a portion functioning as the electrode 5*e* that is electrically connected internally to the electronic components 3, the semiconductor element 4, and the like and is exposed on the backside to be electrically connected to the outside is also formed.

As in Embodiment 1, the thicknesses t5 of the backside conductor 5 constituting the heat sink 5*h* is set to 50 μm or more, preferably 100 μm or more, in order to secure the heat dissipation performance to cope with the increase in heat generation of the semiconductor element. In order to solve the problem associated with the increase in the thickness t5, among the backside conductors, other than the backside conductors 5 functioning as the semiconductor device (individual piece 10), the support members 6 are arranged in regions that are closer to the dicing lines Ld than to the backside conductors 5 and that do not overlap the dicing lines Ld.

However, the dicing line Ld is doubly formed only at boundaries in one of the longitudinal direction and the lateral direction among the longitudinal and lateral boundaries dividing the individual pieces 10, and the support members 6 are arranged between the double lines. For example, as shown in FIG. 13B, the dicing line Ld is doubly formed with respect to the boundaries in the lateral (x) direction, and the support members 6 are arranged between the double lines. Alternatively, as in variation examples shown in FIG. 14A and FIG. 14B, the dicing line Ld may be doubly formed with respect to the boundaries in the longitudinal (y) direction, and the support member 6 may be arranged between the double lines.

Also this case enables the support member 6 to narrow the interval D5 in one of the longitudinal direction and the lateral direction, so that the deformation of the board 2 due to the molding pressure Pm at the time of transfer molding can be prevented even when the backside conductors 5 having the thickness t5 of 50 μm or more, which is excellent in heat dissipation performance, are used. Further, in addition to the effect of Embodiment 1, since the support members 6 are not provided along the longitudinal direction or the lateral direction, spacing between the individual pieces 10 can be reduced. As a result, the number of individual pieces per board can be increased, so that the manufacturing cost can be reduced.

In particular, when the board 2 as the molded article has a rectangular shape instead of a square shape, or when the individual piece 10 has a rectangular shape instead of a square shape, there is a case in which warpage in one direction of the long side or the short side may be larger than warpage in the other direction after the transfer molding. The warpage is caused by a stress due to a difference in the linear expansion coefficient between the mold material 1, the board 2, and the backside conductor 5. In such a case, by removing the support members 6 in the longitudinal direction or the lateral direction along the boundaries parallel to the short side, the stress caused by the difference in the linear expansion coefficient can be reduced, and the warpage can be suppressed and reduced.

That is, by doubly forming the dicing line Ld parallel to the short side, the stress caused by the difference in the linear expansion coefficient can be reduced, and the warpage can be suppressed and reduced. Further, as compared with the case where the support members 6 are provided along the boundaries in both of the longitudinal and lateral directions, the number of times of dicing can be reduced, and the ratio of unnecessary portions 90 can be reduced.

Variation Example

The arrangement of the support members 6 at positions closer to the dicing lines Ld or the boundaries between the adjacent pieces 10 than the backside conductors 5 by doubly forming the dicing lines Ld in one of the longitudinal and lateral direction is not limited to the patterns described with reference to FIG. 13B and FIG. 14B. FIG. 15A to FIG. 15D are bottom views of the molded articles before being cut into individual pieces of the semiconductor devices according to variation examples of Embodiment 2 with the support members having respective different patterns. Note that, although each variation example shows an example in which the support members are arranged along the dicing lines running in the lateral direction (x-direction), the support members may be arranged along the dicing lines running in the longitudinal direction.

Figures 15A, 15B, 15C, 15D:
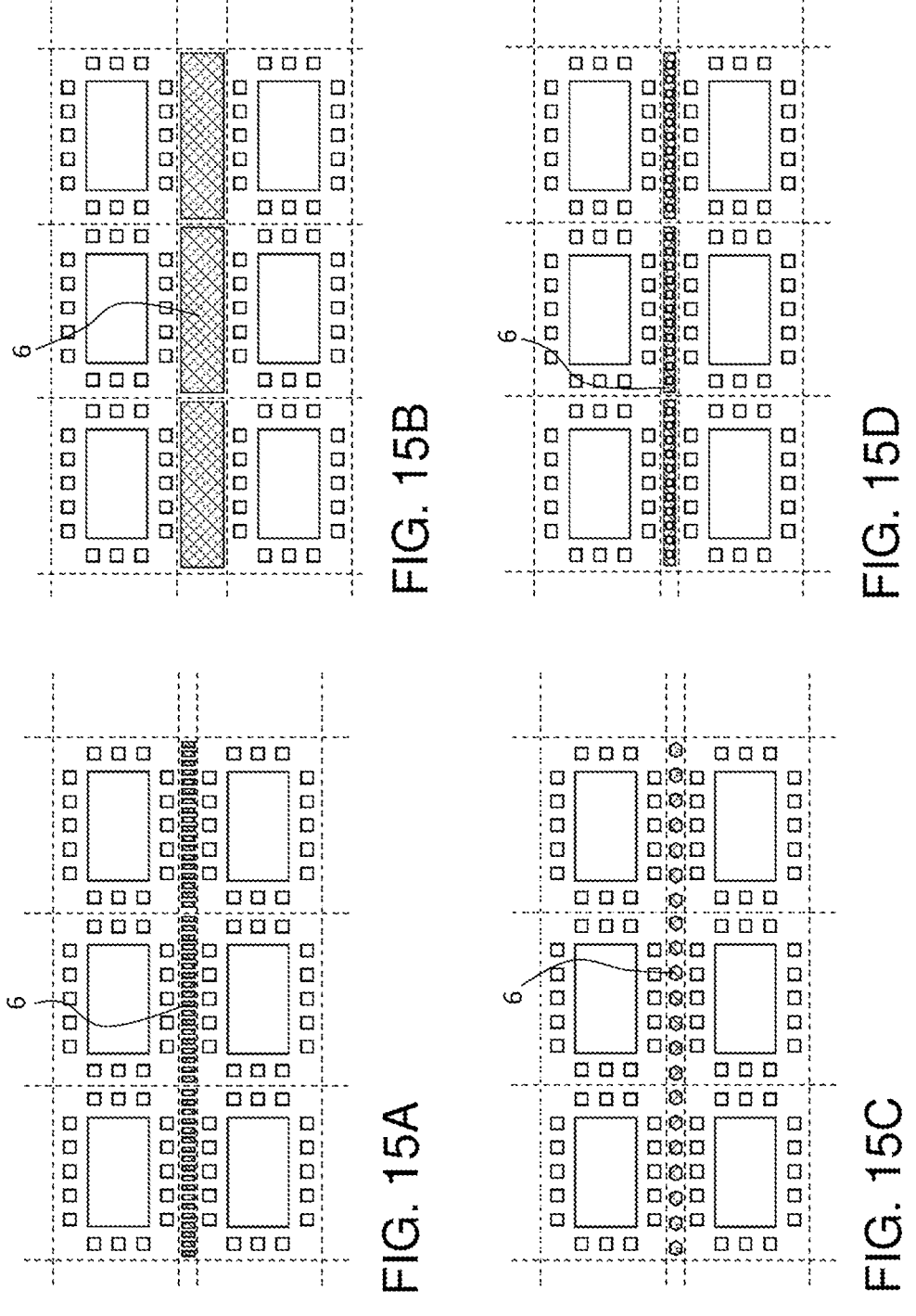
FIG. 15A to FIG. 15D are bottom views of molded articles before individual pieces of the semiconductor devices having support members with respective different patterns according to Embodiment 2 are cut out.

The shape, size, number of divisions, shape of division, and direction of division in the support members 6 are freely determined. That is, as shown in FIG. 15A, the above described effect can also be obtained by arranging a plurality of rectangular support members 6 divided along the dicing lines Ld in the regions surrounded by the dicing lines Ld. Alternatively, as shown in FIG. 15B, the width thereof may be larger or smaller than those shown in FIG. 13B.

In addition, as shown in FIG. 15C, a plurality of circular support members 6 divided along the dicing lines Ld may be arranged in the regions surrounded by the dicing lines Ld. Further, as shown in FIG. 15D, the support member 6 having void portions on the inner side thereof in the plane (x-y plane) direction may be arranged. Furthermore, a combination of multiple shapes, multiple sizes, multiple number of divisions, multiple division shapes, and division directions may be used.

Embodiment 3

Figures 16A, 16B:
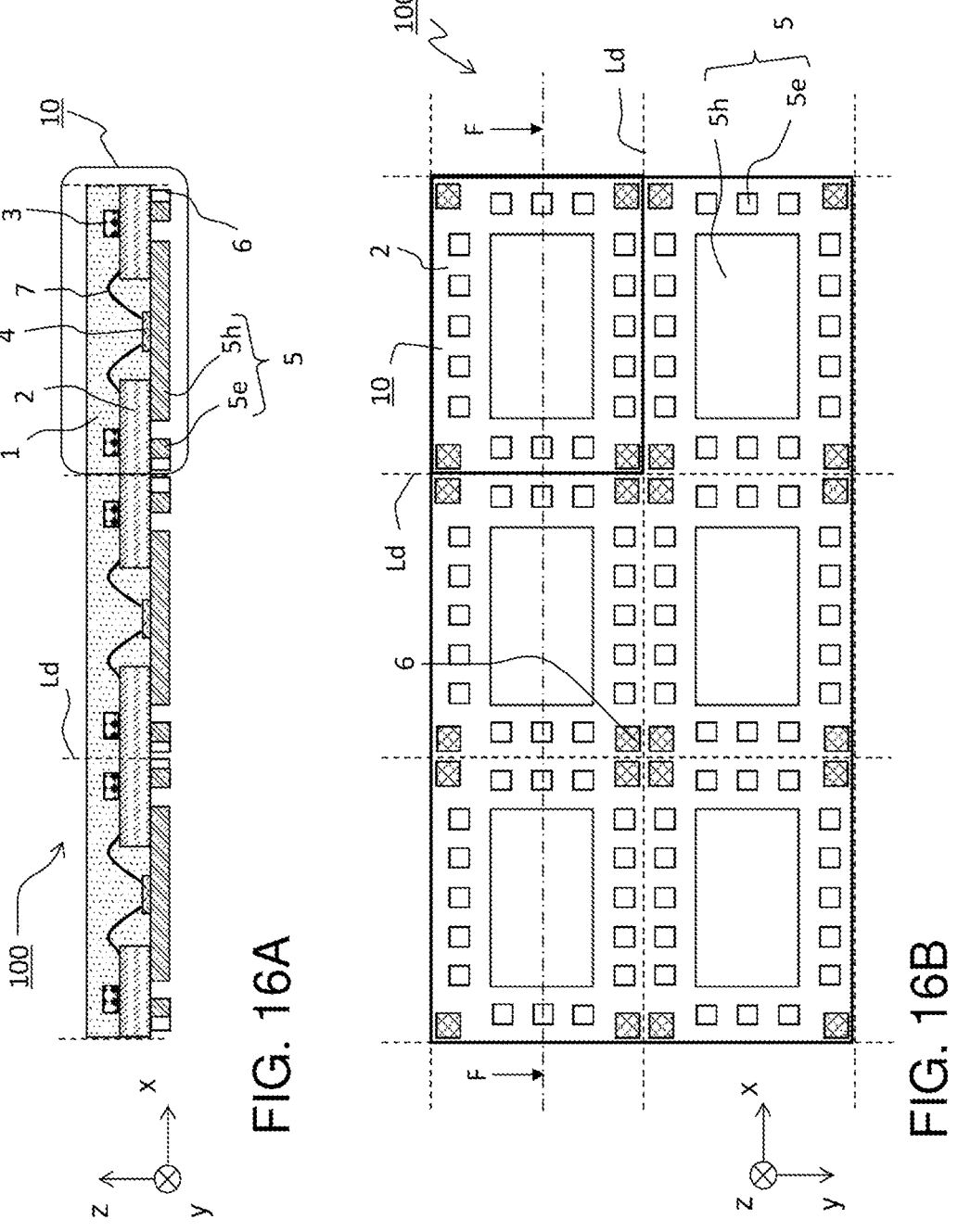
FIG. 16A and FIG. 16B are a cross-sectional view and a bottom view, respectively, of a molded article before being cut into individual pieces of a semiconductor device according to Embodiment 3.

In Embodiment 1 or Embodiment 2, the examples in which the support members are provided between the doubly formed dicing lines has been described, but this is not a limitation. In Embodiment 3, an example is described in which support members are arranged so as to interpose a dicing line and at positions that remains in a divided individual piece. FIG. 16A and FIG. 16B are for explaining a configuration of a semiconductor device according to Embodiment 3, FIG. 16B is a bottom view of a molded article before individual pieces of the semiconductor device are cut out as viewed from the side of backside conductors, and FIG. 16A is a cross-sectional view of the molded article taken along the line F-F of FIG. 16B. Except for the arrangement of the support members, the Embodiment 3 is the same as Embodiment 1 or Embodiment 2, and the description of the same parts is omitted.

In the semiconductor device 100 according to Embodiment 3 as in Embodiment 1 and Embodiment 2, as shown in FIG. 16A and FIG. 16B, the board 2 and the patterned backside conductors 5 are integrated to form a cavity structure, and the backside conductors 5 are used as the heat sink 5*h* on which the semiconductor element 4 is mounted. The semiconductor element is electrically connected to the electronic components 3 mounted on the board 2 with bonding wires 7 or the like, and is sealed with the molding material 1. As the backside conductor 5, in addition to the portion functioning as the heat sink 5*h*, a portion functioning as the electrode 5*e* that is electrically connected internally to the electronic components 3, the semiconductor element 4, and the like and is exposed on the backside to be electrically connected to the outside is also formed.

As in Embodiment 1 and Embodiment 2, the thicknesses t5 of the backside conductor 5 constituting the heat sink 5*h* is set to 50 µm or more, preferably 100 µm or more, in order to secure the heat dissipation performance to cope with the increase in heat generation of the semiconductor element. In order to solve the problem associated with the increase in the thickness t5, among the backside conductors, other than the backside conductors 5 functioning as the semiconductor device (individual piece 10), the support members 6 are arranged in regions that are closer to the dicing lines Ld than to the backside conductors 5 and that do not overlap the dicing lines Ld.

However, the support members 6 are arranged within the regions of the individual pieces 10 so as to interpose the longitudinal and lateral boundaries dividing the individual pieces 10. That is, one dicing line Ld is set with respect to one boundary, and the support members are arranged so as to interpose the dicing line Ld, and particularly are arranged at four portions around the position where the longitudinal and lateral dicing lines Ld intersect with each other. As in Embodiment 1 and Embodiment 2, the support members 6 are formed by patterning at the same time as the backside conductors 5, and are formed to remain within each of the individual pieces 10 when the semiconductor device is divided into the individual pieces 10. However, the support members 6 are not electrically connected by vias, through holes, or the like, and do not have a function as the semiconductor device.

Also in this case, since the support members 6 are arranged at positions closer to the dicing lines Ld than to the backside conductors 5, the interval D5 is narrowed. As a result, the deformation of the board 2 due to the molding pressure Pm at the time of transfer molding can be prevented even when the backside conductors 5 having the thickness t5 of 50 µm or more, which is excellent in heat dissipation performance, are used. Furthermore, in addition to the effects of Embodiment 1 and Embodiment 2, since the dicing line Ld is not doubly formed, the spacing between the individual pieces 10 can be reduced, and the number of individual pieces per board can be increased, so that the manufacturing cost can be reduced.

Variation Example

Note that the arrangement of the support members 6 interposing the longitudinal and lateral dicing lines Ld and being closer to the dicing lines Ld than to the backside conductors 5 that avoid the dicing lines Ld is not limited to the pattern described in FIG. 16B. FIG. 17A to FIG. 17D are bottom views of molded articles before individual pieces of the semiconductor device according to variation examples of Embodiment 3 having support members with respective different patterns are cut out.

Figures 17A, 17B, 17C, 17D:
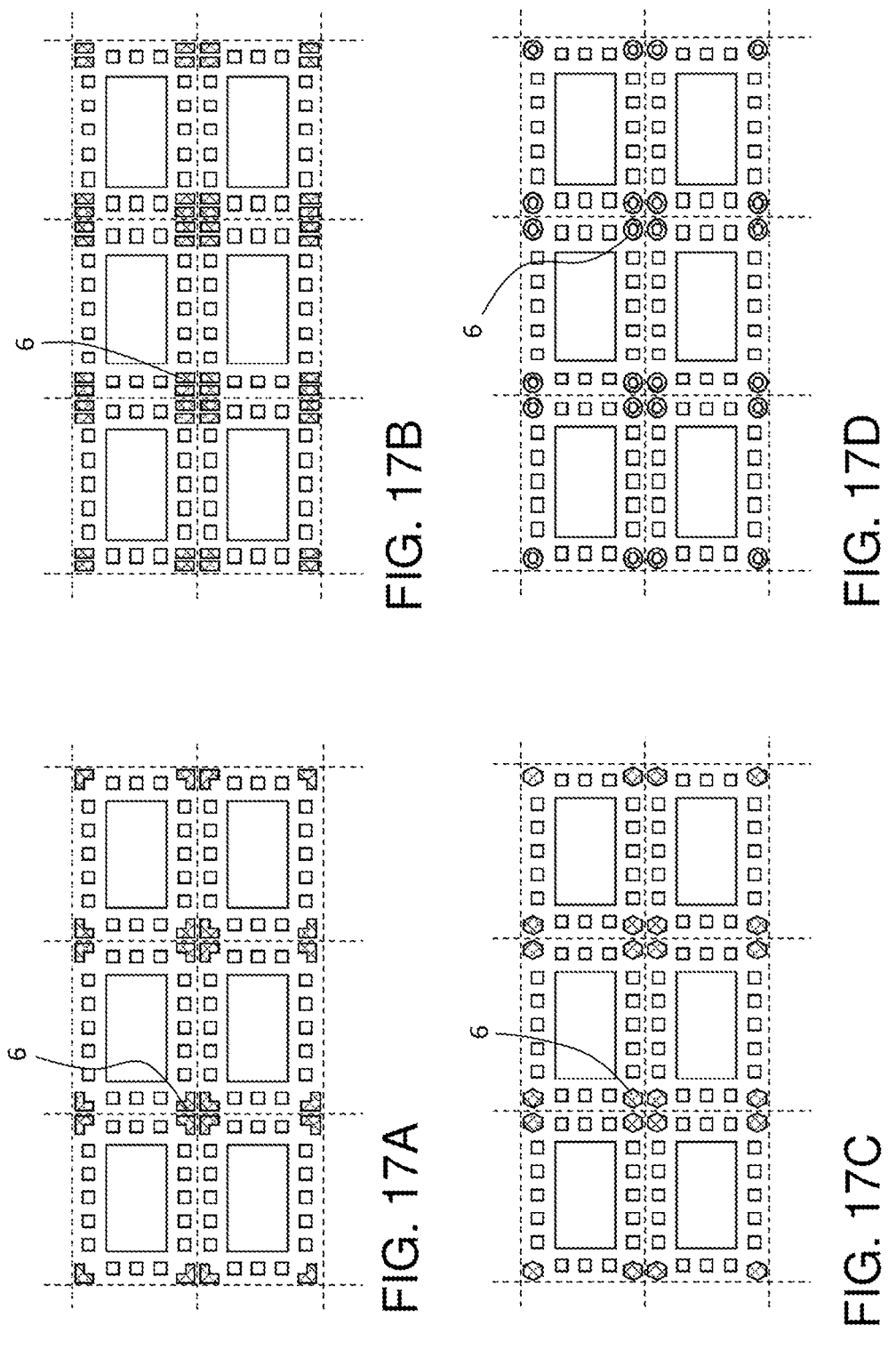
FIG. 17A to FIG. 17D are bottom views of molded articles before individual pieces of the semiconductor devices having support members with respective different patterns according to Embodiment 3 are cut out.

The shape, size, number of divisions, shape of division, and direction of division in the support members 6 arranged within the individual pieces 10 are freely determined. That is, as shown in FIG. 17A, even when L-shaped support members 6 are arranged at portions around the positions where the dicing lines Ld intersect with each other so as to interpose the dicing lines Ld, the above-described effects can be obtained. Alternatively, as shown in FIG. 17B, the support member 6 divided along dicing lines Ld of one direction may be arranged at portions around the positions where the dicing lines Ld intersect with each other.

Further, as shown in FIG. 17C, hexagonal support members 6 may be arranged at portions around the positions where the dicing lines Ld intersect with each other, or as shown in FIG. 17D, annular support members 6 may be arranged. Furthermore, a combination of multiple shapes, multiple sizes, multiple number of divisions, multiple division shapes, and division directions may be used.

Note that, although various exemplary embodiments and examples are described in the present application, various features, aspects, and functions described in one or more embodiments are not limited to the application exemplified in a particular embodiment and can be applicable alone or in their various combinations to each embodiment. Accordingly, countless variations that are not illustrated are envisaged within the scope of the art disclosed herein. For example, the case where at least one component is modified, added or omitted, and the case where at least one component is extracted and combined with a component in another embodiment disclosed are included.

For example, although an example in which the cavity structures are arranged in 2×3 is drawn in each drawing of the embodiments, this is not a limitation and various combinations of the number of connections are possible. Further, it has been described that the thicknesses t5 of the backside conductors 5 (and the support members 6 having the same thickness as the backside conductors 5) are 50 µm or more, and preferably 100 µm or more, from the viewpoint of improving the heat dissipation performance. In addition, from the viewpoint of preventing deformation of the board 2, it is described that there is no noticeable influence on the quality when the thickness is 30 µm or less. However, even in a case where the thickness is thin, the heat dissipation performance is improved as long as the cavity structure is adopted, and in the portion in which the interval D5 is wide, deformation depending on the thickness occurs, and thus narrowing the interval D5 by providing the support members 6 disclosed in the present application is effective for the quality improvement.

As described above, according to the semiconductor device 100 of the present application, the semiconductor device 100 is an article integrally molded with the mold material 1 sealing a front side of the board 2 including the semiconductor element 4, in which a plurality of cavity structures are formed in a matrix form by the board 2 in which a plurality of openings are arranged in a matrix form and by the backside conductors 5 arranged on the backside of the board 2, and a portion of the backside conductors 5 that blocks each of the plurality of openings from the backside functions as the heat sink 5*h* on which the semiconductor element 4 is mounted. In the backside conductors 5, a portion thereof serving as the electrode 5*e* for electrical connection to the outside is formed in addition to the heat sink 5*h* so as to correspond to each of the plurality of cavity structures, and a portion thereof that is at a position separated from dicing lines Ld for dividing each of the cavity structures into an individual piece and is arranged closer to the dicing lines Ld than to the heat sink 5*h* and the electrode 5*e* is formed to function as the support member 6 interposed between the molding die 80 and the board 2 at a time of integral molding with the mold material 1. Even when the molding pressure Pm in the transfer molding is applied to the board 2, the support member 6 supports the board 2, so that deformation can be prevented. Therefore, it is possible to obtain the semiconductor device 100 and thus the individual piece 10 that are low-cost and have high heat dissipation performance.

Here, when the support member 6 is arranged between double dicing lines Ld drawn with an interval between adjacent individual pieces, the support member 6 does not remain in the individual piece 10, and thus the individual piece 10 can be made compact.

In this case, if the double dicing lines Ld are drawn in one of the longitudinal direction (y-direction) and the lateral direction (x-direction), the spacing between the individual pieces 10 can be reduced and the number of individual pieces per board can be increased as compared with the case where the double dicing lines Ld are drawn in both of the longitudinal direction and the lateral direction. In addition, the number of times of dicing can be reduced.

Further, in this case, when the double dicing lines are drawn in a direction parallel to the short side of the semiconductor device 100, the stress caused by the difference in the linear expansion coefficient between the members can be reduced, and the warpage can be suppressed and reduced.

Alternatively, when the support member 6 is arranged at a position on the inner side to the dicing line Ld in each of the individual pieces 10, the spacing between the individual pieces 10 can be reduced to the maximum, and the number of individual pieces obtained per board can be increased. Therefore, the manufacturing cost can be reduced. In addition, the number of times of dicing can be reduced.

When the thicknesses t5 of the backside conductors 5 (and the support member 6) are 50 μm or more, an increase in the chip temperature Tc can be suppressed within an appropriate range.

In particular, when the thicknesses t5 of the backside conductors 5 (and the support member 6) are 100 μm or more, the increase in the chip temperature Tc can be reliably suppressed within an appropriate range even when there are variations in the performance of the elements.

DESCRIPTION OF REFERENCE NUMERALS AND SIGNS

1: mold material, 10: individual piece, 100: semiconductor device, 2: board, 3: electronic component, 4: semiconductor element, 5: backside conductor, 5e: electrode, 5h: heat sink, 6: support member (backside conductor), 80: molding die, D5: interval, Ld: dicing line, Px: intersection, t5: thickness.

The invention claimed is:

1. A semiconductor device in which a plurality of cavity structures are formed in a matrix form by a board in which a plurality of openings are arranged in a matrix form and by backside conductors arranged on a backside of the board, and a portion of the backside conductors that blocks each of the plurality of openings from the backside functions as a heat sink on which a semiconductor element is mounted, and that is an article integrally molded with a mold material sealing a front side of the board including the semiconductor element, the semiconductor device comprising:

the backside conductors in which a portion thereof serving as an electrode for electrical connection to an outside is formed in addition to the heat sink so as to correspond to each of the plurality of cavity structures, and a portion thereof that is at a position separated from dicing lines for dividing each of the cavity structures into an individual piece and is arranged closer to the dicing lines than to the heat sink and the electrode is formed to function as a support member interposed between a molding die and the board at a time of integral molding with the mold material.

2. The semiconductor device according to claim 1, wherein the support member is arranged between double dicing lines drawn with an interval between adjacent individual pieces.

3. The semiconductor device according to claim 2, wherein the double dicing lines are drawn in one of a longitudinal direction and a lateral direction.

4. The semiconductor device according to claim 3, wherein the double dicing lines are drawn in a direction parallel to a short side of the semiconductor device.

5. The semiconductor device according to claim 1, wherein the support member is arranged at a position on an inner side to the dicing line in each individual piece.

6. The semiconductor device according to claim 1, wherein the backside conductors have a thickness of 50 μm or more.

7. The semiconductor device according to claim 2, wherein the backside conductors have a thickness of 50 μm or more.

8. The semiconductor device according to claim 3, wherein the backside conductors have a thickness of 50 μm or more.

9. The semiconductor device according to claim 4, wherein the backside conductors have a thickness of 50 μm or more.

10. The semiconductor device according to claim 5, wherein the backside conductors have a thickness of 50 μm or more.

11. The semiconductor device according to claim 6, wherein the backside conductors have a thickness of 100 μm or more.

12. The semiconductor device according to claim 7, wherein the backside conductors have a thickness of 100 μm or more.

13. The semiconductor device according to claim 8, wherein the backside conductors have a thickness of 100 μm or more.

14. The semiconductor device according to claim 9, wherein the backside conductors have a thickness of 100 μm or more.

15. The semiconductor device according to claim 10, wherein the backside conductors have a thickness of 100 μm or more.

* * * * *